United States Patent
Tani et al.

(10) Patent No.: US 6,335,077 B1
(45) Date of Patent: Jan. 1, 2002

(54) ELECTRICALLY CONDUCTIVE PASTE FOR VIA-HOLE AND METHOD OF PRODUCING MONOLITHIC CERAMIC SUBSTRATE USING THE SAME

(75) Inventors: Hiroji Tani, Nagaokakyo; Kazuhito Ohshita, Omihachiman, both of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/159,580

(22) Filed: Sep. 24, 1998

(30) Foreign Application Priority Data

Sep. 26, 1997 (JP) ............................................ 9-261229

(51) Int. Cl.⁷ .............................. H01B 1/20; H05K 1/09
(52) U.S. Cl. .................... 428/138; 428/137; 428/131; 428/402; 428/403; 428/901; 252/512; 252/513; 252/514; 252/515; 252/519.3; 252/519.32; 252/519.33; 29/852; 156/89.18; 156/89.12; 156/89.16; 427/97; 361/751; 174/257; 106/1.18
(58) Field of Search .................. 428/131, 137, 428/138, 402, 403, 901; 252/512, 513, 514, 515, 519.3, 519.32, 519.33; 427/97; 156/89.18, 89.12, 89.16; 29/852; 174/257; 361/751; 106/1.18

(56) References Cited

U.S. PATENT DOCUMENTS

| | | | | |
|---|---|---|---|---|
| 4,833,033 A | * | 5/1989 | Sannohe et al. | 428/407 |
| 4,885,038 A | * | 12/1989 | Anderson, Jr. et al. | 156/89 |
| 5,492,653 A | | 2/1996 | Hochheimer et al. | 252/514 |
| 5,652,042 A | * | 7/1997 | Kawakita et al. | 428/209 |
| 5,985,461 A | * | 11/1999 | Tani et al. | 428/433 |

FOREIGN PATENT DOCUMENTS

| | | |
|---|---|---|
| EP | 0449309 | 10/1991 |
| EP | 0485910 | 5/1992 |
| EP | 0572343 | 12/1993 |
| JP | 2276104 | 11/1990 |

\* cited by examiner

Primary Examiner—William P. Watkins, III
(74) Attorney, Agent, or Firm—Ostrolenk, Faber, Gerb & Soffen, LLP

(57) ABSTRACT

As an electrically conductive paste for via-holes, an organic vehicle and an electrically conductive metal powder coated with a resin which is insoluble in the organic vehicle are prepared. Filling via-holes with the electrically conductive paste for via-holes produces a monolithic ceramic. Filling characteristics of the electrically conductive paste into via-holes are improved, and cracks and elevations of the conductive metal and cracks of the ceramic barely form during the baking step. Further, the resulting monolithic ceramic substrate can maintain excellent soldering wettability and plating characteristics.

8 Claims, 1 Drawing Sheet

ELECTRICALLY CONDUCTIVE PASTE FOR VIA-HOLE AND METHOD OF PRODUCING MONOLITHIC CERAMIC SUBSTRATE USING THE SAME

BACKGROUND OF THE INVENTION

1. Field of the Invention

The present invention relates to an electrically conductive paste for a via-hole and a method of producing a monolithic ceramic substrate using the same, and particularly, relates to an electrically conductive paste for filling a via-hole formed in a green ceramic sheet and a method of producing a monolithic ceramic substrate comprising filling via-holes with the electrically conductive paste.

2. Description of the Related Art

A monolithic ceramic substrate has been known in which green ceramic sheets provided with electrodes and circuits are laminated and the electrodes and circuits formed on these sheets are electrically connected with via-holes.

The monolithic ceramic substrate is fabricated by the following steps. Via-holes are formed in green ceramic sheets with a drill or punch and filled with an electrically conductive paste containing an electrically conductive metal powder. Electrodes and circuits are formed on surfaces of the green ceramic sheets by a screen printing process or the like using an electrically conductive paste for forming the circuits. A plurality of green ceramic sheets are laminated, pressed, cut into a given substrate size, and baked for sintering.

In the conventional process, however, when the via-holes are filled with the electrically conductive paste, unsuccessful filling including insufficient filling or excessive filling will occur, cracks and elevations of the conductive metal (the sintered conductive metal powder) will form in the via-holes, or cracks will form in the ceramic. The cracks and elevations of the conductive metal and the cracks of the ceramic cause the failure of conductivity and structural defects, resulting in deteriorated reliability of the monolithic ceramic substrate.

SUMMARY OF THE INVENTION

It is an object of the present invention to provide an electrically conductive paste for a via-hole which barely forms cracks and elevations of the conductive metal and cracks of the ceramic during the baking step and which imparts high reliability to the resulting monolithic ceramic substrate, and to provide a method of producing a monolithic ceramic substrate using the same.

The preferred embodiment of the present invention provides an electrically conductive paste for a via-hole comprising an organic vehicle and an electrically conductive metal powder coated with a resin which is insoluble in a solvent contained in the organic vehicle.

In the above described electrically conductive paste for a via-hole, the electrically conductive metal powder is preferably copper powder and the insoluble resin is preferably a crystalline cellulose.

The preferred embodiment of the present invention further provides a method of producing a monolithic ceramic substrate comprising the steps of forming via-holes in a green ceramic sheet; filling the via-hole with an electrically conductive paste containing an organic vehicle and an electrically conductive metal powder coated with a resin which is insoluble in a solvent in the organic vehicle; forming a laminate by laminating a plurality of the green ceramic sheets filled with the electrically conductive paste; and baking the laminate.

The preferred embodiment of the present invention further provides a monolithic ceramic substrate, comprising a ceramic substrate; a via-hole provided in the ceramic substrate; and an electrically conductive paste provided in the via-hole, the electrically conductive paste comprising an organic vehicle and an electrically conductive metal powder coated with a resin which is insoluble in a solvent in the organic vehicle.

In the above described monolithic ceramic, the ceramic substrate may have a laminated structure.

The electrically conductive paste for via-holes in accordance with the present invention has improved filling characteristics into via-holes. Further, in the production of a monolithic ceramic substrate, the coated insoluble resin delays shrinkage of the conductive metal powder in the baking step, and hence it prevents cracks and elevations of the conductive metal and cracks of the ceramic. Since the insoluble resin is decomposed in the baking step, the resulting monolithic ceramic substrate can maintain excellent solder wettability and plating characteristics.

In the electrically conductive paste for via-holes in accordance with the present invention, the use of copper powder as the conductive metal powder causes the specific resistance to decrease and migration to be prevented. Since it is inexpensive, the resulting monolithic ceramic substrate is economical and has high reliability.

In the electrically conductive paste for via-holes in accordance with the present invention, use of crystalline cellulose as the insoluble resin can reduce deterioration of conductive resistance because it has excellent decomposition characteristics.

In accordance with the method of producing a monolithic ceramic substrate using the electrically conductive paste for via-holes of the present invention, cracks and elevations of the conductive metal and cracks of the ceramic barely form in the baking step. The resulting monolithic ceramic substrate does not substantially have structural defects in the via-holes and thus has satisfactory conductivity and high reliability. Since the insoluble resin in the electrically conductive paste is decomposed in the baking step, the resulting monolithic ceramic substrate can maintain satisfactory solder wettability and plating characteristics.

Other features and advantages of the present invention will become apparent from the following description of the invention which refers to the accompanying drawings.

DETAILED DESCRIPTION OF THE PREFERRED EMBODIMENTS

The organic vehicle used in the present invention is composed of a resinous component dissolved in an organic solvent. Any known organic vehicle used in conductive pastes for forming thick films can be used. Preferably, such an organic vehicle is appropriately selected in consideration of a combination with an organic binder used in the production of green ceramic sheets. For example, it may be ethyl cellulose resin dissolved in a terpineol solvent.

Any known metal powder having electrical conductivity can be used as the electrically conductive metal powder used in the present invention. Examples of powders include powders of noble metals, e.g. Ag, Pd, Pt and Au, alloys thereof, base metals, e.g. Cu and Ni, and alloys thereof. A preferred metal powder is copper powder having low specific resistance, not causing migration and being inexpensive. These electrically conductive metal powders may be used alone or in a combination of at least two types. The preferred shape of the electrically conductive metal powder is a sphere or granule in order to readily achieve coating using an insoluble resin (as described later) and to improve the filling characteristics in the via-holes. Preferably, the particle size is approximately 0.5 to 50 $\mu$m.

The electrically conductive metal powder is coated with a resin which is insoluble in a solvent contained in the organic vehicle. An appropriate insoluble resin is selected depending on the type of the solvent contained in the organic vehicle. A crystalline cellulose is preferably used in view of degradation characteristics during baking. The insoluble resin is preferably used as powder when coating the electrically conductive metal powder. The amount of the insoluble resin is not limited as long as the electrically conductive metal powder can be coated, and is generally in a range of about 5 to 100 parts by weight to 100 parts by weight of the electrically conductive metal powder.

The electrically conductive metal powder coated with the insoluble resin can be prepared by a dry mixing process using a ball mill, a surface fusing (mechanofusion) process or an impact-type surface modification process in a high-speed jet stream.

Figure 1:
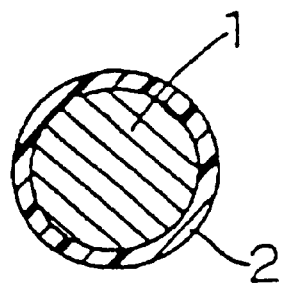
FIG. 1 shows an electrically conductive metallic powder coated with an insoluble resin.
Figure 2:
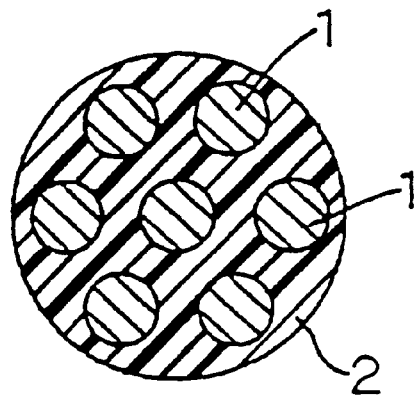
FIG. 2 shows an electrically conductive metallic powder coated with an insoluble resin having a configuration which is different from that in FIG. 1.

Such coating causes, for example as shown in FIG. 1, a state in which a layered insoluble resin 2 is adhered on the surface of the electrically conductive metal powder 1. As shown in FIG. 2, another state in which a plurality of electrically conductive metal powders 1 are included in the insoluble resin 2 is also available.

The electrically conductive paste of the present invention is prepared by compounding and mixing the electrically conductive metal powder coated with the insoluble resin and the organic vehicle. In the mixing, for example, about 5 to 25 parts by weight of the organic vehicle are compounded with 100 parts by weight of the electrically conductive metal powder and the mixture is mixed by any known method, for example, using a three-roll mill.

The electrically conductive paste of the present invention, prepared in such a manner, is used as an electrically conductive paste for filling not only so-called via-holes, in a narrow sense, for connecting internal electrodes and internal circuits, but also via-holes including through-holes formed so as to bore through the ceramic substrate. It improves filling characteristics in the via-holes.

In the production of the monolithic ceramic substrate described later, the coated insoluble resin can delay shrinkage of the electrically conductive metal powder in the baking step, and hence the conductive metal barely forms cracks and elevations and the ceramic barely cracks. Since the insoluble resin disappears by decomposition in the baking step, soldering characteristics and plating characteristics can be satisfactorily maintained.

The method of producing the monolithic ceramic substrate with via-holes using the electrically conductive paste will now be described.

Figure 3:
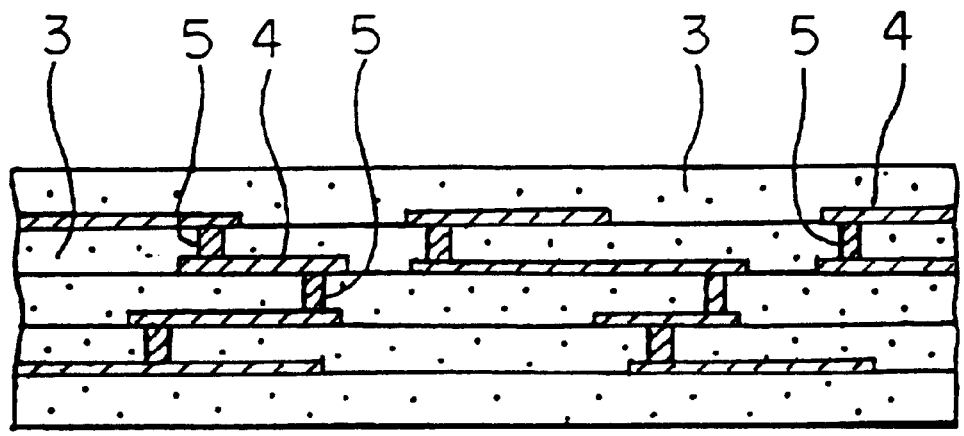
FIG. 3 is a cross-sectional view of a laminate composed of green ceramic sheets in an preferred embodiment in accordance with the present invention.

For the purpose of forming green ceramic sheets, a ceramic powder, such as a $BaO—Al_2O_3—SiO_2$-type glass composite material is prepared, an organic binder such as polyvinyl butyral, and an organic solvent such as toluene, are added to the powder, and then these are mixed to prepare a raw slurry. A sheet is formed from the resulting raw slurry by a doctor blade method. Via-holes are formed in the green ceramic sheet with a drill or a punch and filled with the electrically conductive paste in accordance with the present invention by a screen printing method or the like. An electrically conductive paste for forming circuits is printed onto the surface of the green ceramic sheet by a screen printing process or the like to from electrodes and circuits. A plurality of green ceramic sheets after printing are laminated, pressed, and cut into a given substrate size. In the resulting laminate of a plurality of green ceramic sheets 3 as shown in FIG. 3, electrodes and circuits 4 formed on the surfaces of individual green ceramic sheets 3 are connected to each other through via-holes 5. The electrodes and circuits 4 formed in individual layers are electrically connected to each other through conductive metal in the via-holes 5 which will be sintered in the following sintering step. The sintering may be performed at approximately 1,000° C. for approximately 1 to 2 hours in a nitrogen atmosphere.

The sheet does not need to be cut into a given substrate size. Any known ceramic material, organic binder and organic solvent other than those described above may be used. Further, the structure of the ceramic substrate can be determined according to the desired purpose.

The monolithic ceramic substrate prepared by such a method does not substantially have cracks and elevations in the conductive metal nor cracks in the ceramic. Thus, structural defects barely occur in the via-holes and satisfactory conductivity is ensured, resulting in high reliability. Since the insoluble resin disappears by decomposition during the baking step, satisfactory soldering and plating characteristics are maintained.

The present invention will now be described in detail with reference to the following preferred embodiment.

1) Preparation of Electrically Conductive Paste

As an electrically conductive metal powder, 80 parts by weight of copper powder with a particle size of 3 $\mu$m and, as an insoluble resin, 5 parts by weight of a crystalline cellulose powder were prepared, and then mixed by a dry process using a ball mill so that the surface of the copper powder was coated with the crystalline cellulose powder. To 100 parts by weight of the resulting powder, 15 parts by weight of an organic vehicle composed of an ethyl cellulose resin dissolved in a terpineol solvent was compounded and mixed with a three-roll mill to prepare an electrically conductive paste belonging to the present invention.

2) Production of Monolithic Ceramic Substrate

A $BaO—Al_2O_3—SiO_2$-type glass composite material was prepared as a ceramic material. Polyvinyl butyral as an organic binder and toluene as an organic solvent were added to the powder, and then these were mixed to prepare a raw slurry. A sheet was formed from the resulting raw slurry by a doctor blade method to form a green ceramic sheet. Via-holes were formed in the resulting ceramic green sheet with a punch and filled with the electrically conductive paste in accordance with the present invention which was prepared in procedure 1) by a screen printing method. After drying for a few minutes, an electrically conductive paste for forming circuits was printed onto the surface of the green ceramic sheet by a screen printing process to form electrodes and circuits. A plurality of green ceramic sheets after printing were laminated, pressed and cut into a given substrate size. The laminate was sintered at approximately 1,000° C. for approximately 1 to 2 hours in a nitrogen atmosphere to prepare a monolithic ceramic substrate.

The resulting monolithic ceramic substrate was degreased with a solvent to remove oil components and the oxide film on the surface, subjected to activation using a Pd solution and then electroless Ni plated.

Comparative Example

1) Preparation of Electrically Conductive Paste

An electrically conductive paste, as a comparative example, that does not belong to the present invention was prepared as in the Example except that coating of the crystalline cellulose powder on the copper powder was not performed.

2) Production of Monolithic Ceramic Substrate

A monolithic ceramic substrate was prepared as in the preferred embodiment except that the electrically conductive paste prepared in procedure 1 and not belonging to the present invention was used.

Evaluation

The monolithic ceramic substrates of the Example and the Comparative Example were cut, and the cut faces were observed with a stereoscopic microscope to check for cracks and elevations of the conductive metal and cracks of the ceramic. The results are shown in Table 1.

The surfaces of the Ni plating films formed on the conductive metal surface in the via-hole of the monolithic ceramic substrates of the Example and the Comparative Example were observed with a scanning electronic microscope to check plating characteristics. The conductive metal surface in the via-hole was soldered to check wettability. The results are also shown in Table 1.

While the invention has been particularly shown and described with reference to preferred embodiments thereof, it will be understood by those skilled man in the art that the forgoing and other changes in form and details may be made therein without departing from the spirit of the invention.

What is claimed is:

1. An electrically conductive paste for a via-hole comprising
    an organic vehicle comprising a solvent and an electrically conductive metal powder coated with a crystalline cellulose resin which is insoluble in the solvent of said organic vehicle and which resin decomposes when the paste is baked.

2. The electrically conductive paste for a via-hole according to claim 1, wherein said electrically conductive metal powder is copper powder.

3. A monolithic ceramic substrate, comprising
    a ceramic substrate;
    a via-hole in said ceramic substrate; and
    an electrically conductive paste in said via-hole,
    wherein said electrically conductive paste comprises an organic vehicle comprising a solvent and an electrically conductive metal powder coated with a crystalline cellulose resin which is insoluble in the solvent in said organic vehicle and which resin decomposes when the paste is baked.

4. The monolithic ceramic substrate according to claim 3, wherein said ceramic substrate has a laminated structure.

5. The monolithic ceramic substrate according to claim 4, wherein said electrically conductive metal powder is copper powder.

6. The monolithic ceramic substrate according to claim 3, wherein said electrically conductive metal powder is copper powder.

7. A method of producing a monolithic ceramic substrate, comprising the steps of
    providing a green ceramic sheet having via-holes;
    filling said via-holes with an electrically conductive paste comprising an organic vehicle comprising a solvent and an electrically conductive metal powder coated with a crystalline cellulose resin which is insoluble in the solvent of said organic vehicle and which resin decomposes when the paste is baked;

TABLE 1

| | Conductive paste | | | Results of evaluation | | | | |
|---|---|---|---|---|---|---|---|---|
| | Copper powder (parts by weight) | Crystalline cellulose powder (parts by weight) | Organic vehicle (parts by weight) | Crack | Elevation | Crack of ceramic | Plating characteristics | Solder wettability |
| Example | 80 | 5 | 15 | None Found | None | None | Good | Good |
| Comparative Example | 80 | 0 | 20 | Found | None | None | Good | Good |

As shown in Table 1, cracks are observed in the conductive metal in the via-hole for the Comparative Example in which the copper powder is not coated with the crystalline cellulose powder. In contrast, no crack or elevation is observed in the conductive metal in the via-hole and no crack is observed in the ceramic for the Example in which the copper powder is coated with the crystalline cellulose powder, while satisfactorily maintaining solder wettability and plating characteristics.

forming a laminate by laminating a plurality of said green ceramic sheets having via-holes filled with said electrically conductive paste; and baking said laminate.

8. The method of producing a monolithic ceramic substrate according to claim 7, wherein said electrically conductive metal powder is copper powder.

* * * * *